United States Patent
Kai et al.

(10) Patent No.: US 7,960,266 B2
(45) Date of Patent: Jun. 14, 2011

(54) SPACER PATTERNS USING ASSIST LAYER FOR HIGH DENSITY SEMICONDUCTOR DEVICES

(75) Inventors: James Kai, Santa Clara, CA (US); George Matamis, San Jose, CA (US); Tuan Duc Pham, San Jose, CA (US); Masaaki Higashitani, Cupertino, CA (US); Takashi Orimoto, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 12/791,103

(22) Filed: Jun. 1, 2010

(65) Prior Publication Data

US 2010/0240182 A1    Sep. 23, 2010

Related U.S. Application Data

(63) Continuation of application No. 11/623,315, filed on Jan. 15, 2007, now Pat. No. 7,773,403.

(51) Int. Cl.
 *H01L 21/336* (2006.01)
 *H01L 21/3205* (2006.01)
 *H01L 21/4763* (2006.01)

(52) U.S. Cl. ........ 438/587; 438/261; 438/262; 438/264; 438/595; 438/701; 257/E21.179; 257/E21.209; 257/E21.422; 257/E21.68; 257/E21.681

(58) Field of Classification Search ........... 257/E21.179, 257/E21.209, E21.422, E21.68, E21.681
See application file for complete search history.

(56) References Cited

U.S. PATENT DOCUMENTS

| | | | |
|---|---|---|---|
| 4,776,922 A | 10/1988 | Bhattacharyya et al. | |
| 5,459,091 A | 10/1995 | Hwang | |
| 6,040,220 A | 3/2000 | Gardner et al. | |
| 6,066,534 A | 5/2000 | Son | |
| 6,413,812 B1 | 7/2002 | Harshfield | |
| 6,746,920 B1 | 6/2004 | Wen et al. | |
| 6,888,755 B2 | 5/2005 | Harari | |
| 6,893,919 B2 | 5/2005 | Chuang et al. | |
| 7,026,684 B2 | 4/2006 | Sakuma et al. | |
| 7,402,886 B2 | 7/2008 | Yuan | |
| 7,592,225 B2 | 9/2009 | Kai et al. | |
| 7,773,403 B2 | 8/2010 | Kai et al. | |
| 2002/0031887 A1 | 3/2002 | Harshfield | |
| 2003/0181047 A1* | 9/2003 | Chang | 438/692 |
| 2004/0002203 A1 | 1/2004 | Deshpande et al. | |

(Continued)

OTHER PUBLICATIONS

U.S. Appl. No. 11/623,315, filed Jan. 15, 2007.

(Continued)

*Primary Examiner* — Mohsen Ahmadi
(74) *Attorney, Agent, or Firm* — Vierra Magen Marcus & DeNiro LLP

(57) ABSTRACT

High density semiconductor devices and methods of fabricating the same are provided. Spacer fabrication techniques are utilized to form circuit elements having reduced feature sizes, which in some instances are smaller than the smallest lithographically resolvable element size of the process being used. Spacers are formed that serve as a mask for etching one or more layers beneath the spacers. An etch stop pad layer having a material composition substantially similar to the spacer material is provided between a dielectric layer and an insulating sacrificial layer such as silicon nitride. When etching the sacrificial layer, the matched pad layer provides an etch stop to avoid damaging and reducing the size of the dielectric layer. The matched material compositions further provide improved adhesion for the spacers, thereby improving the rigidity and integrity of the spacers.

18 Claims, 11 Drawing Sheets

U.S. PATENT DOCUMENTS

| | | |
|---|---|---|
| 2005/0272259 A1 | 12/2005 | Hong |
| 2006/0046484 A1 | 3/2006 | Abatchev et al. |
| 2006/0108648 A1 | 5/2006 | Yuan |
| 2006/0264002 A1 | 11/2006 | Tran et al. |
| 2006/0286749 A1 | 12/2006 | Tseng et al. |
| 2007/0076485 A1* | 4/2007 | Lutze et al. .............. 365/185.22 |
| 2007/0128787 A1 | 6/2007 | Higashitani |
| 2007/0231999 A1 | 10/2007 | Wang et al. |
| 2007/0243680 A1 | 10/2007 | Harari et al. |
| 2008/0123385 A1 | 5/2008 | Aritome |
| 2008/0171406 A1 | 7/2008 | Orimoto et al. |
| 2008/0171428 A1 | 7/2008 | Kai et al. |

OTHER PUBLICATIONS

Chan, et al., "A True Single Transistor Oxide-Nitride-Oxide EEPROM Device," IEEE Electron Device Letters, vol. EDL-8, No. 3, Mar. 1987, pp. 93-95.

Nozaki, et al., "A 1-MbEEPROM with MONOS Memory Cell for Semiconductor Disk Application," Journal of Solid State Circuits, vol. 26, No. 4, Apr. 1991 IEEE, pp. 497-501.

International Search Report & The Written Opinion of the International Searching Authority dated Jul. 4, 2008, Patent Cooperation Treaty, Application No. PCT/US2008/051017, filed Jan. 14, 2008.

Preliminary Amendment dated Apr. 6, 2007, U.S. Appl. No. 11/623,314, filed Jan. 15, 2007.

Office Action dated Jan. 7, 2008, U.S. Appl. No. 11/623,314, filed Jan. 15, 2007.

Preliminary Amendment dated Jan. 10, 2008, U.S. Appl. No. 11/623,314, filed Jan. 15, 2007.

Response A to Office Action dated May 8, 2008, U.S. Appl. No. 11/623,314, filed Jan. 15, 2007.

Office Action dated Aug. 21, 2008, U.S. Appl. No. 11/623,314, filed Jan. 15, 2007.

Response B to Office Action dated Sep. 22, 2008, U.S. Appl. No. 11/623,314, filed Jan. 15, 2007.

Final Office Action dated Dec. 29, 2008, U.S. Appl. No. 11/623,314, filed Jan. 15, 2007.

Response C to Final Office Action dated Mar. 2, 2009, U.S. Appl. No. 11/623,314, filed Jan. 15, 2007.

Notice of Allowance and Fee(s) Due dated Mar. 20. 2009, U.S. Appl. No. 11/623,314, filed Jan. 15, 2007.

Notice of Allowance and Fee(s) Due dated May 4, 2009, U.S. Appl. No. 11/623,314, filed Jan. 15, 2007.

Preliminary Amendment dated Apr. 6, 2007, U.S. Appl. No. 11/623,315, filed Jan. 15, 2007.

Office Action dated Mar. 17, 2009, U.S. Appl. No. 11/623,315, filed Jan. 15, 2007.

Response A to Office Action dated Jun, 17, 2009, U.S. Appl. No. 11/623,315, filed Jan. 15, 2007.

Notice of Non-Compliant Amendment dated Sep. 15, 2009, U.S. Appl. No. 11/623,315, filed Jan. 15, 2007.

Response B to Notice of Non-Compliant Amendment dated Oct. 15, 2009, U.S. Appl. No. 11/623,315, filed Jan. 15, 2007.

Notice of Allowance and Fee(s) Due dated Feb. 26, 2010, U.S. Appl. No. 11/623,315, filed Jan. 15, 2007.

U.S. Appl. No. 11/623,314, filed Jan. 15, 2007.

* cited by examiner

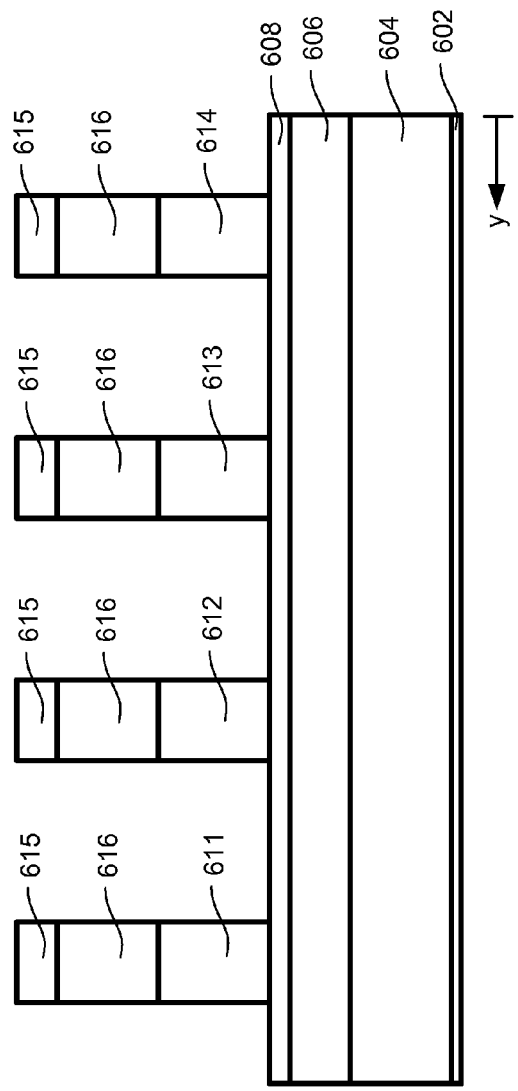
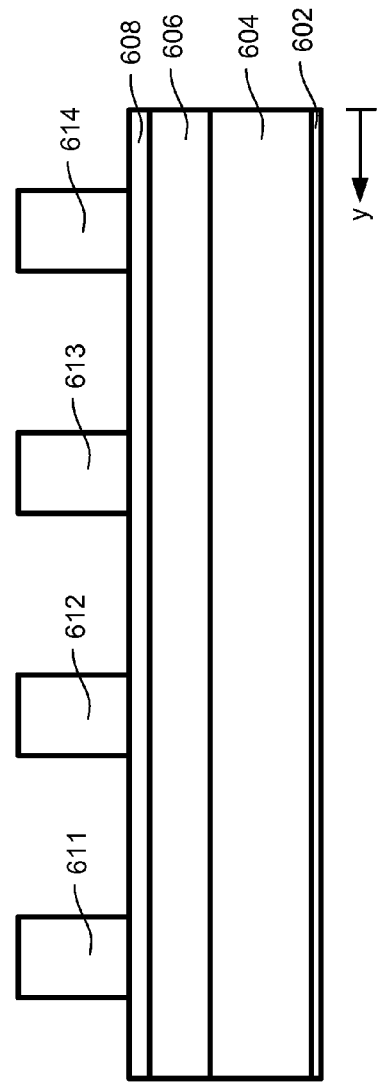
FIG. 6C
FIG. 6D

US 7,960,266 B2

SPACER PATTERNS USING ASSIST LAYER FOR HIGH DENSITY SEMICONDUCTOR DEVICES

CLAIM OF PRIORITY

This application is a continuation application of U.S. patent application Ser. No. 11/623,315, entitled "SPACER PATTERNS USING ASSIST LAYER FOR HIGH DENSITY SEMICONDUCTOR DEVICES," filed Jan. 15, 2007, now U.S. Pat. No. 7,773,403, which is incorporated herein by reference in its entirety.

CROSS-REFERENCE TO RELATED APPLICATION

The following application is cross-referenced and incorporated by reference herein in its entirety:

U.S. patent application Ser. No. 11/623,314, entitled "Methods of Forming Spacer Patterns Using Assist Layer for High Density Semiconductor Devices," by James Kai, et al., filed Jan. 15, 2007, now U.S. Pat. No. 7,592,225.

BACKGROUND OF THE INVENTION

1. Field of the Invention

Embodiments of the present disclosure are directed to high density semiconductor devices, such as non-volatile memory, and methods of forming the same.

2. Description of the Related Art

In most integrated circuit applications, there is continual pressure to shrink the substrate area required to implement the various integrated circuit functions. Semiconductor memory devices, for example, and the fabrication processes therefore are continuously evolving to meet demands for increases in the amount of digital data that can be stored in a given area of a silicon substrate. Such demands stem from a desire to increase the storage capacity of a given size memory card and other types of packages, or to both increase capacity and decrease size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 includes a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from doped polysilicon material. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of a typical non-volatile flash array are divided into discrete blocks of cells that are erased together. That is, the block contains the minimum number of cells that are separately erasable together as an erase unit, although more than one block may be erased in a single erasing operation. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. For example, U.S. Pat. No. 6,888,755, entitled "Flash Memory Cell Arrays Having Dual Control Gates Per Memory Cell Charge Storage Element," by Eliyahou Harari, describes a process that utilizes spacers to achieve an element length and a corresponding space therebetween that is smaller than a minimum definable lithographic feature size. Such decreases in the sizes of circuit elements, as well as other considerations, increase the need for precision in fabrication processes and integrity in resulting materials.

SUMMARY OF THE INVENTION

High density semiconductor devices and methods of fabricating the same are provided in accordance with one or more embodiments. Spacer fabrication techniques are utilized to form circuit elements having reduced feature sizes, which in some instances are smaller than the smallest lithographically resolvable element size of the process being used. Spacers are formed that serve as a mask for etching one or more layers to form one or more circuit elements beneath the spacers. An intervening layer having a material composition substantially similar to the spacer material is provided between a dielectric layer and an insulating sacrificial layer such as silicon nitride. When etching the sacrificial layer, the intervening layer serves as an etch stop layer to avoid damaging and reducing the size of the underlying dielectric layer. By utilizing matched material compositions, improved adhesion is provided for the spacers, thereby improving the rigidity and integrity of the spacers.

Other features, aspects, and objects of the disclosed technology can be obtained from a review of the specification, the figures, and the claims.

BRIEF DESCRIPTION OF THE DRAWINGS

FIGS. 6A-6I depict a portion of the memory array of FIG. 4 at various steps during a fabrication process in accordance with one embodiment.

DETAILED DESCRIPTION

Embodiments in accordance with the present disclosure can be used in the formation of numerous types of high density semiconductor devices. A spacer and corresponding formation technique are provided to reduce the size of the fabricated elements. While not so limited, the described techniques can achieve feature sizes that are smaller than the smallest lithographically resolvable element size of the process being used. This can facilitate the high density formation of numerous types of elements in integrated semiconductor device fabrication. Various features and techniques are presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

Figure 1:
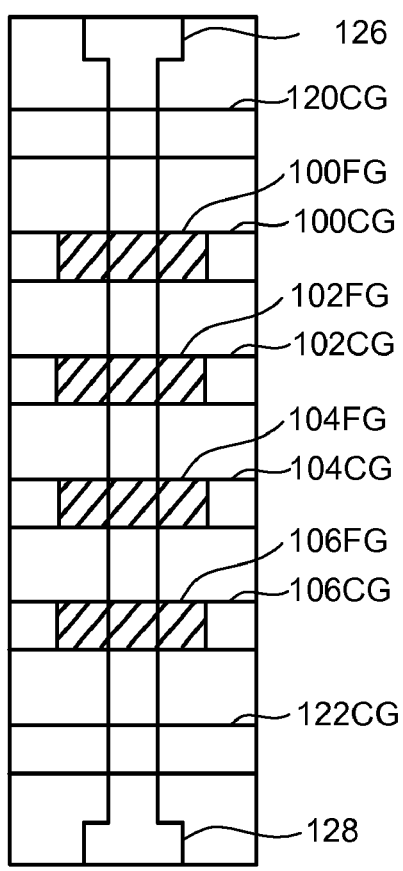
FIG. 1 is a top view of a NAND string.
Figure 2:
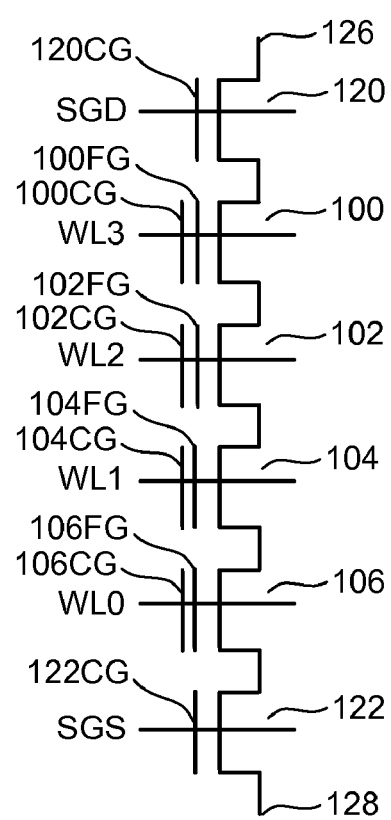
FIG. 2 is an equivalent circuit diagram of the NAND string depicted in FIG. 1.
Figure 3:
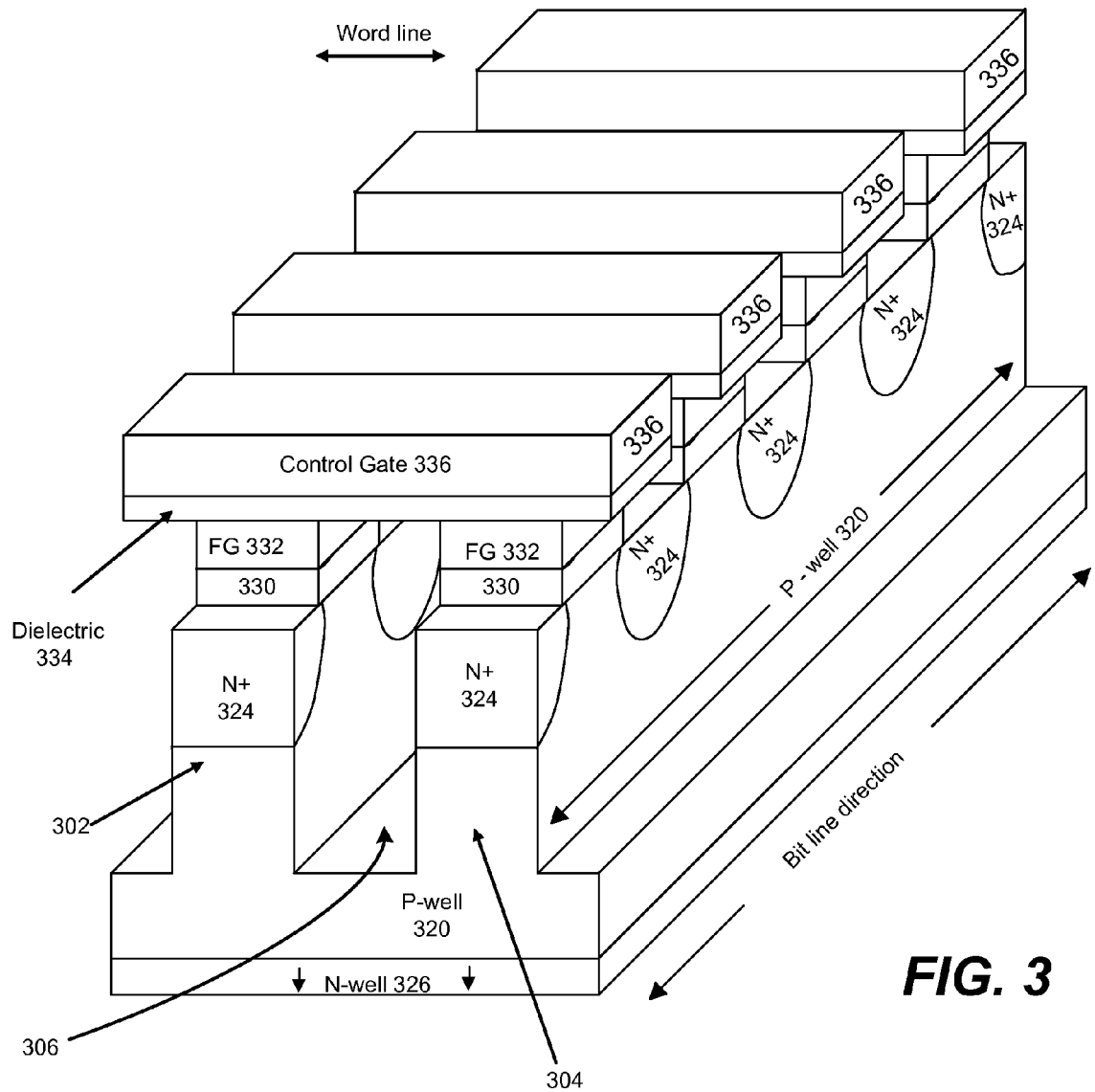
FIG. 3 is a three-dimensional drawing of a pair of four word line long portions of two NAND strings that can be fabricated in accordance with one embodiment.

FIG. 3 is a three-dimensional block diagram of two typical NAND strings 302 and 304 that may be fabricated as part of a larger flash memory array. While FIG. 3 depicts four memory cells on strings 302 and 304, more or less than four memory cells can be used. FIG. 3 further depicts N-well 326 below P-well 320, the bit line direction along the NAND string, and the word line direction perpendicular to the NAND string or bit line direction. The P-type substrate below N-well 336 is not shown in FIG. 3. In one embodiment, the control gates form the word lines. A continuous layer of conductive layer 336 is formed which is consistent across a word line in order to provide a common word line or control gate for each device on that word line. An individual control gate layer 336 is depicted in FIG. 3 which forms a single word line for a plurality of memory cells in a row. In such a case, this layer can be considered to form a control gate for each memory cell at the point where the layer overlaps a corresponding floating gate layer 332. In other embodiments, individual control gates can be formed and then interconnected by a separately formed word line.

When fabricating a NAND-based non-volatile memory system, including NAND strings as depicted in FIG. 3, it is important to provide electrical isolation in the word line direction between adjacent strings such as NAND strings 302 and 304. In the embodiment depicted in FIG. 3, NAND string 302 is separated from NAND string 304 by an open area or void 306. In typical NAND configurations, a dielectric material is formed between adjacent NAND strings and would be present at the position of open area 306.

Figure 4:
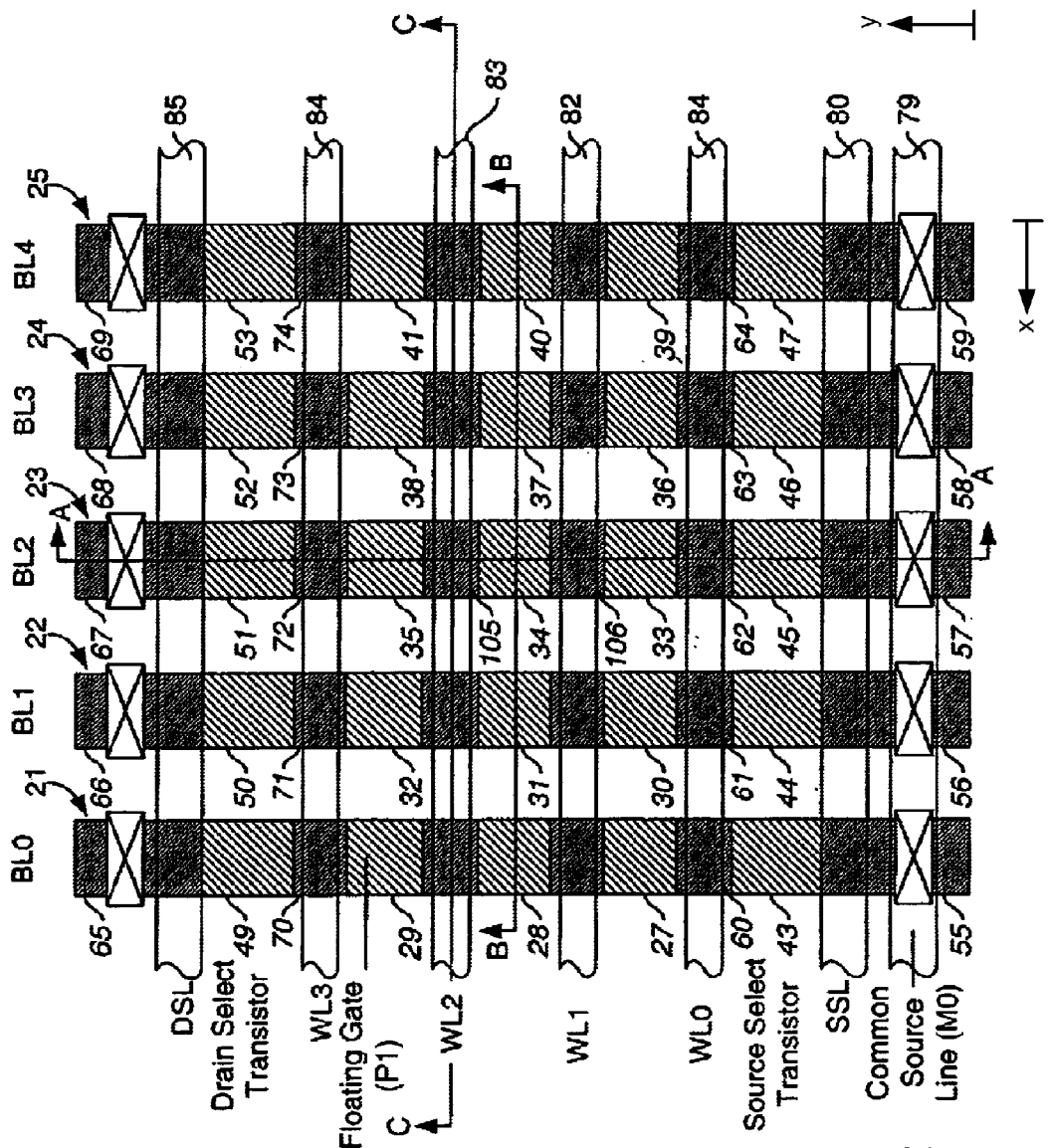
FIG. 4 is a plan view of a portion of a NAND flash memory array in accordance with one embodiment.

Major components of a few memory cells of a NAND array that can be fabricated in accordance with one embodiment are illustrated in plan view in FIG. 4. Five NAND strings 21-25 of series connected memory cells are included, with three floating gate charge storage elements shown in each string. String 21 includes floating gates 27, 28, 29, string 22 includes floating gates 30, 31, 32, the string 23 includes floating gates 33, 34, 35, string 24 includes floating gates 36, 37, 38, and string 25 includes floating gates 39, 40, and 41. Only a small rectangular array of fifteen memory cells is illustrated for ease of explanation. Actual implementations of such an array typically include millions of such memory cells forming thousands of NAND strings, each string normally having 16, 32 or more memory cells. It is understood that the memory array is typically positioned over one or more well regions contained within a common substrate in order to allow the local substrate potential of the memory array to be electrically controlled independent of the common substrate potential. The use of the term substrate with respect to a memory array of transistors may include reference to such well regions.

Each of the NAND strings 21-25 includes two select transistors, one at each end of the string, to controllably connect the string between a different one of global bit lines BL0-BL4 and a reference potential $V_S$, typically provided at a common source line. $V_S$ is normally ground during reading but may assume a small positive value during programming to assist in minimizing leakage across the source select transistor. Voltage $V_{SSL}$ is applied to respective source select gates 43-47 to control connection of one end of their respective memory cell strings 21-25 to the common source line. The other ends of the strings 21-25 are connected through respective drain select transistors to the respective bit lines BL0-BL4 by voltage $V_{DSL}$ applied to drain select gates 49-53. Column control circuitry described hereinafter applies a voltage to each bit line that is representative of the specific data to be written, or to sense the voltage or current of a corresponding string or memory cell during a read or verify operation. The select transistors include respective source and drain regions 55-64 and 65-74 in a semiconductor substrate 402 at its surface 401.

A typical NAND array includes control gate (word) lines extending across multiple strings, over rows of floating gates with a suitable insulating dielectric layer therebetween. Close coupling between the control and floating gates is desirable in order to minimize the control gate voltages that are required to raise the coupled floating gates to the voltage levels necessary for programming and reading their states. One control gate (word) line is used for each row of floating gates. In order to make an array with the floating and control gates self-aligned in a y-direction (along the lengths of the NAND strings), the control gates are typically used as masks to form the floating gates, which then have the same dimensions in the y-direction as the control gates.

In the NAND array presented hereinafter, control gate (word) lines 81-84 are positioned between the floating gates instead of on top of them. Each control gate line extends across multiple strings of memory cells and is capacitively coupled through a suitable insulating dielectric, such as multi-layer oxide-nitride-oxide (ONO), to the floating gates on both sides. Additional coupling area is obtained by using the sidewall areas of both sides of the floating gates. The floating gates can be made thicker (higher) than usual in order to increase this coupling area, and the control gates in between them are then made to be at least as thick as the floating gates in order to take advantage of the added coupling area. An advantage is that this coupling area may be controlled largely independently of the coupling area of the floating gates and the substrate, resulting in a desirably high coupling ratio even as the coupling area of the floating gates with the substrate is reduced during future decreases in device dimensions. The principles, devices and techniques disclosed hereinafter can also be used with more traditional NAND architectures having word lines positioned above floating gates.

Two control gate lines replace a single word line of conventional NAND arrays in the hereinafter described example. For example, the word line that would extend across the row of floating gates 27, 30, 33, 36 and 39 in a conventional array is replaced by two control gate lines 81 and 82 (WL0 and WL1). Similarly, a word line that would normally extend across the row of floating gates 28, 31, 34, 37 and 40 is replaced by two control gate lines 82 and 83 (WL1 and WL2). The control lines 81-84 are elongated in the x-direction across the array and separated in the y-direction by the length of the intervening floating gates and the thicknesses of the dielectric layers between them. Although the size of the memory floating gate is typically made as small as the photolithography allows in both x and y dimensions, the channel length of the select transistors 43-47 and 49-53 (y-dimension) is typically slightly larger than the minimum feature size to ensure it can effectively block all conduction including leakage when the maximum voltage is applied across it.

Figure 5:
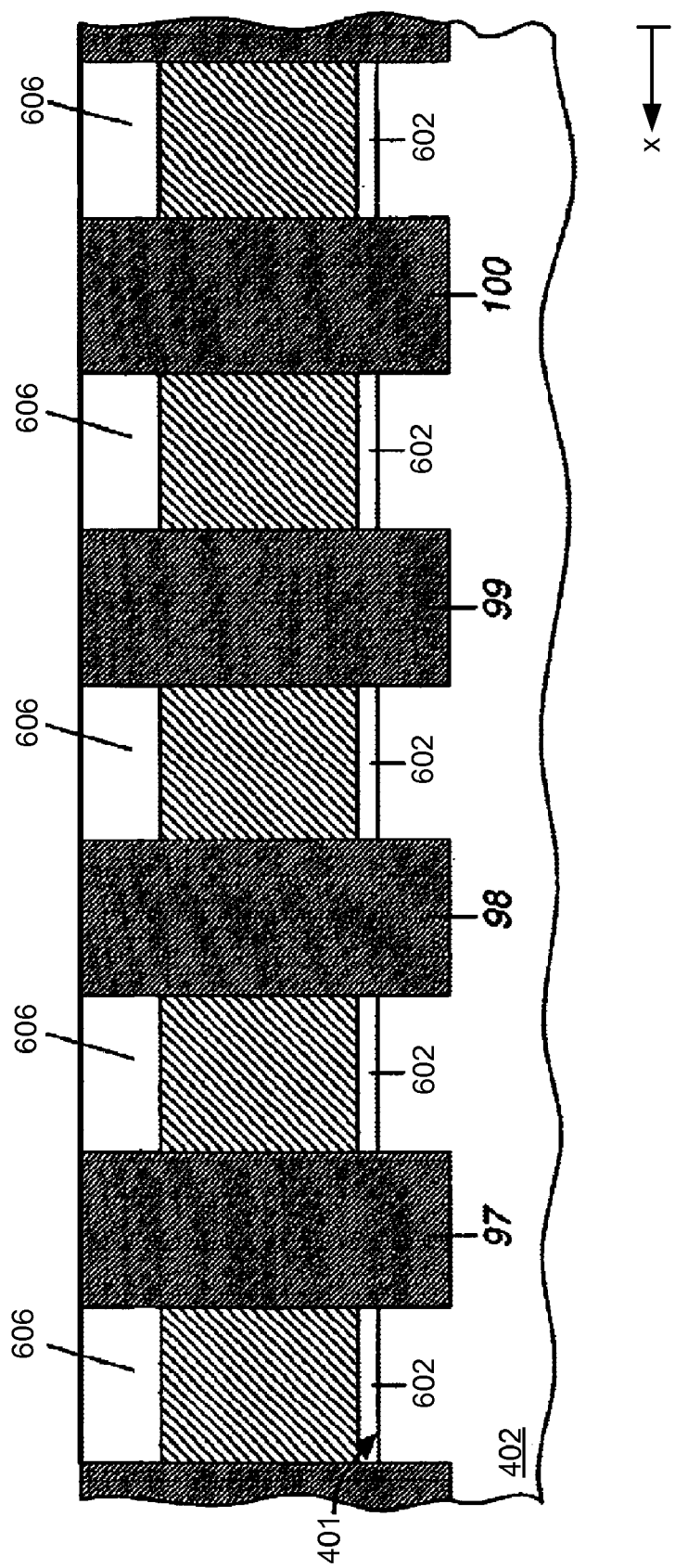
FIG. 5 is an orthogonal cross-sectional view taken along a line B-B of the portion of the flash memory array depicted in FIG. 4.

FIGS. 5 and 6A-6I depict the fabrication of a portion of an exemplary NAND memory array in accordance with one embodiment that includes two word lines per row of floating gates. A small portion of the memory array is depicted at various steps of the fabrication process to highlight select portions of the process. Various other steps known to those of ordinary skill in the art are omitted for conciseness of explanation of the disclosed principles. Modifications to the disclosed process can be made in other implementations as will be appreciated. FIG. 5 depicts an orthogonal cross-sectional view taken along a line B-B in the x-direction along a row of memory cells extending across multiple strings depicted in FIG. 4. FIGS. 6A-6I depict an orthogonal cross-sectional view taken along a line A-A in the y-direction through one string of memory cells depicted in FIG. 4. Note that in FIGS. 6A-6I, the substrate and well region(s) are not illustrated.

One or more wells (e.g., a triple well) are typically formed in substrate 402, according to the requirements of a particular implementation. After implanting and associated annealing of the well(s) to dope the substrate 402, a layer 602 of tunnel dielectric material is formed on the surface 401 of the substrate. Different materials can be used for layer 602, but silicon oxide (SiO$_2$) is often grown on the surface 401 to form a tunnel oxide having a thickness of about 8 nm. The dielectric layer can also be deposited using known chemical vapor deposition (CVD) processes, metal organic CVD processes, physical vapor deposition (PVD) processes, atomic layer deposition (ALD) processes, grown using a thermal oxidation process, or formed using another suitable process.

A first layer 604 of doped polysilicon is then formed over at least the area of the array, typically by low-pressure chemical vapor deposition (LPCVD), although other processes can be used. The floating gates will be formed later from this first polysilicon layer. Different thicknesses of the first polysilicon layer can be formed. For example, thicknesses ranging from 50 to 200 nm can be used in one embodiment. This is thicker than the usual first polysilicon layer in many NAND devices, with the result that the later formed floating gates are thicker than those of many traditional devices. Other embodiments may utilize other materials to form the charge storage regions.

A thin pad 606 of silicon dioxide is then formed over the top of the polysilicon layer. Different thicknesses can be used for the oxide pad in accordance with various embodiments. In one embodiment, silicon dioxide is deposited to about 40 nm to form a thin pad of high temperature oxide (HTO). Other materials can be used in other implementations. The oxide or other pad formed over the doped polysilicon layer will later be used as a mask when forming the individual floating gates or other charge storage regions.

A sacrificial layer of silicon nitride (Si$_3$N$_4$) is then deposited to a thickness typically between 100 and 300 nm. A mask is formed on the top of the nitride layer for etching the exposed nitride, oxide pad, polysilicon and tunnel oxide to leave stacked strips elongated across the substrate in the y-direction, and separated from one another in the x-direction. Typically, the separation in the x-direction is the smallest spacing dimension resolvable by the mask formation process. The width of the strips is also preferably made equal to their spacing. The etch is anisotropic and exposes the surface 401 of the substrate 402 between these strips.

A next series of steps provides electrical isolation between resulting columns of floating gates. Shallow Trench Isolation (STI) is employed in one embodiment whereby the exposed substrate surface is anisotropically etched to form trenches 97-100 (FIG. 5) that are elongated in the y-direction and positioned between the polysilicon/dielectric stack strips in the x-direction. These trenches can be etched to a depth of 100-300 nm. The exposed silicon surface region may be implanted with a light boron dose to locally increase the field oxide threshold voltage if needed. A thick oxide layer is then deposited over the entire array area to completely fill these trenches and the spaces between the polysilicon/dielectric stacked strips. Excess oxide above the stacked strips is removed by Chemical Mechanical Polishing (CMP). A relatively flat surface then exists across the tops of the thick oxide 97-100 and oxide pad strips 606. As is well known in the art, high temperature annealing may be employed to relieve the mechanical stress in the silicon isolation trenches as well as to densify the thick oxide in these trenches. The trenches isolate adjacent columns of memory cells and their corresponding active regions of the substrate from each other to define individual NAND strings.

Various techniques for forming the isolation trenches can be used. It is possible to form the array without employing shallow trench isolation, for example, by forming thick dielectric isolation above the silicon surface rather than in trenches etched into it. LOCOS or SWAMI techniques as previously described can be used in embodiments. In some embodiments, the isolation trenches may be formed prior to the floating gates and/or tunnel dielectric. Deep self-aligned trenches are formed in one embodiment, as described in: U.S. patent application Ser. No. 10/996,030, entitled "SELF-ALIGNED TRENCH FILLING WITH HIGH COUPLING RATIO," by Jack H. Yuan, filed Nov. 23, 2004; and U.S. patent application Ser. No. 11/251,386, entitled "SELF-ALIGNED TRENCH FILLING FOR NARROW GAP ISO-LOATION REGIONS," by Jack H. Yuan, filed Oct. 14, 2005, both incorporated by reference herein in their entirety.

Figure 6A:
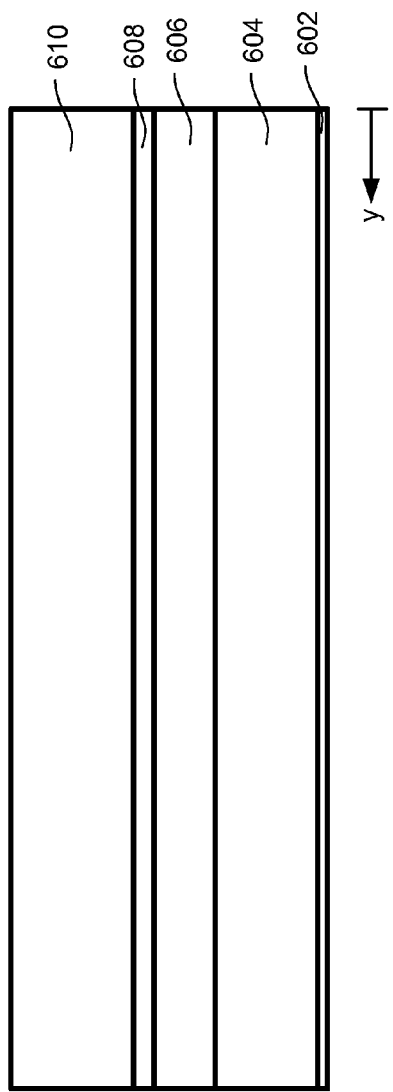

A layer 608 of undoped polysilicon is then formed on top of the planarized surface. A second sacrificial layer 610 of silicon nitride ($Si_3N_4$) is formed on this undoped polysilicon layer 608. Different thicknesses of nitride layer 610 can be used. For example, the nitride is deposited to a thickness of between 80 and 110 nm in one embodiment. FIG. 6A depicts the portion of the memory array after forming intervening layer 608 and nitride layer 610. In one embodiment, undoped polysilicon layer 608 and nitride layer 610 are formed prior to etching the substrate surface to form the shallow isolation trenches, rather than after as described above.

Undoped polysilicon layer 608 can serve as an etch stop layer during later fabrication steps. Additionally, the undoped polysilicon will provide a stable base for subsequently formed polysilicon spacers used in the formation of individual floating gate regions. The material composition of layer 608 is chosen so as to provide adequate adhesion for these thinly formed spacers. The use of matched materials for the spacers and layer 608 serves the dual functions of providing an etch stop as part of the spacer formation, and providing a matched surface to facilitate adhesion of the spacers. Providing adequate adhesion between the spacers and an underlying layer is of increased importance as the spacers are continually fabricated with thinner dimensions and increased aspect ratios. Additionally, the use of the same or similar materials for the spacers and intervening layer can help with stresses between the different films. If layers of different materials are used, the different materials will have different coefficients of thermal expansion. The different thermal coefficients can cause stress at the interface of the different materials. When the same or similar materials are used in accordance with one or embodiments as provided herein, matching thermal coefficients can decrease stresses at the material interfaces.

In traditional spacer fabrication processes, an additional etch stop layer 608 has not been provided. Spacers have been formed directly on the high temperate oxide layer 606 or other dielectric layer provided above the conductive gate region 604. Simply forming polysilicon on oxide layer 606 may not provide adequate adhesion to support the subsequently formed spacers. These thin spacers may essentially fall over or fail after being formed and directional supports (e.g., nitride 610) removed as part of the fabrication process. Other material combinations may also have inadequate adhesive properties, and consequently, not provide suitable rigidity and integrity for the fabrication. Additionally, when an additional polysilicon layer 608 is not used, thus exposing the oxide layer during subsequent etching of nitride layer 610, the etch process may not stop precisely at the upper surface of oxide layer 606. This can damage the oxide such that unwanted growth may occur therein during subsequent fabrication steps. Additionally, unintended etching of the oxide pad 606 can ultimately result in undesirable variations in the thickness of the tunnel oxide layer 602. When variances in the tunnel oxide thickness occur, memory cell performance variances can also occur. For instance, variances in the thickness can affect the threshold voltage characteristics of the resulting memory cells. Programming, erasing and reading the memory cells can all be affected by variations in the characteristics of individual memory cells.

In FIGS. 6A-6I, the intervening layer 608 and spacer layer 618 are both formed of undoped polysilicon. In other embodiments, different materials may be used. For example, a nitride intervening layer 608 is used in one embodiment with a nitride spacer layer 618. The sacrificial nitride layer 610 can be replaced with silicon dioxide in one such embodiment.

Figure 6B:
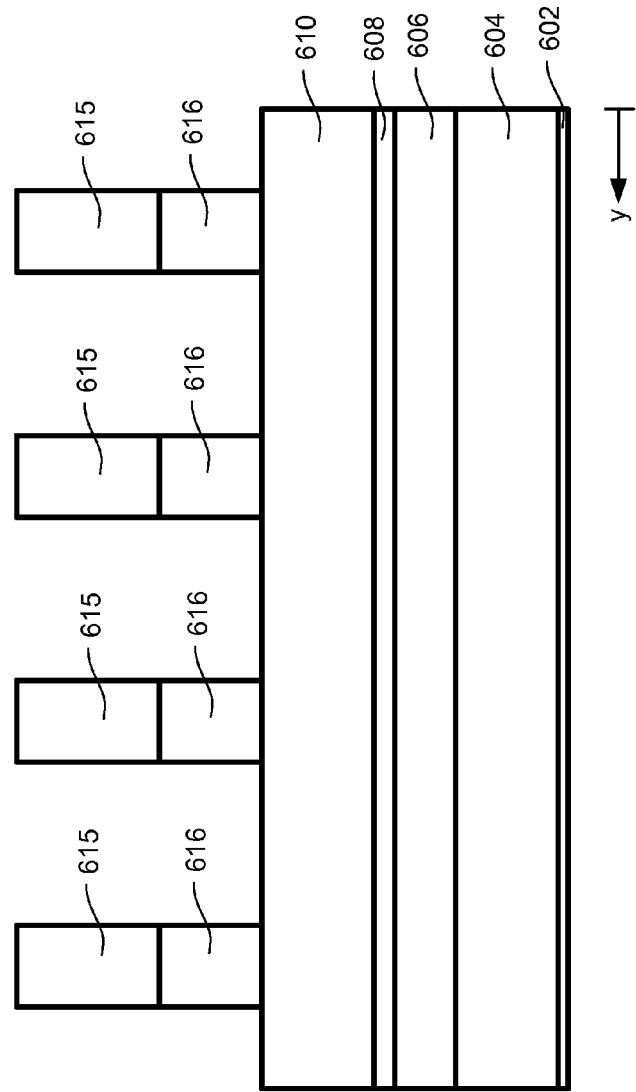

A mask is formed over nitride layer 610 to begin forming the individual floating gate regions for the array. The mask can be formed of strips of photoresist 615 that are formed over a bottom anti-reflective coating (BARC) 616. The masking strips are formed to extend in the x-direction, and have widths and spacing in the y-direction that are determined by the lithographically minimum resolvable element size. FIG. 6B depicts the portion of the memory array along line A-A after forming the strips of photoresist 615 and BARC 616. In one embodiment, the photoresist has a thickness of about 210 nm and the BARC has a thickness of about 90 nm.

Using the photoresist as a mask, nitride layer 610 is etched, resulting in the array as shown in FIG. 6C with nitride strips 611, 612, 613, and 614. Polysilicon layer 608 serves as an etch stop layer when etching nitride layer 610 as described above. This differs from more traditional fabrication processes that do not use an intervening layer 608 that can provide a stop for the nitride etch process. Because etching is inherently uncontrollable to some extent, inadvertent etching and damage to HTO layer 606 can occur in such instances, having the deleterious effects previously described. In the present disclosure, polysilicon 608 is highly resistive to the nitride etching process. A suitable process selected for etching nitride layer 610 can abruptly stop the etching when polysilicon layer 608 is reached. A selective etch for nitride will stop upon reaching the polysilicon, thereby reducing or eliminating variances in the thickness of layer 606, which can ultimately lead to variances in the thickness of tunnel oxide layer 602. Moreover, damage to and/or reduction in size of HTO layer 606 can be avoided. By providing an intervening layer between the oxide layer 606 and sacrificial nitride, the integrity of the oxide layer can be maintained throughout formation of the floating gates as hereinafter described.

The photoresist layer 615 and BARC layer 616 are next removed using a combination of $O_2$ plasma ashing followed by wet chemical etching in one embodiment. A piranha oxidizing or other cleaning process can be used to remove remaining photoresist and other organic materials from the wafer surfaces. FIG. 6D shows the portion of the memory array after removing the photoresist to expose the upper surface of nitride layer 610. The width of the resulting strips can be made smaller than the width of the mask strips by undercutting or over-etching sideways. The relatively thick nitride strips 610 that result extend in the x-direction across the polysilicon layer 608 and the isolation oxide formed in trenches 97-100. The etching step is further controlled in order not to remove excessive amounts of isolation oxide between the polysilicon strips 604 extending in the y-direction (regions 97-100 in FIG. 5).

Figure 6E:
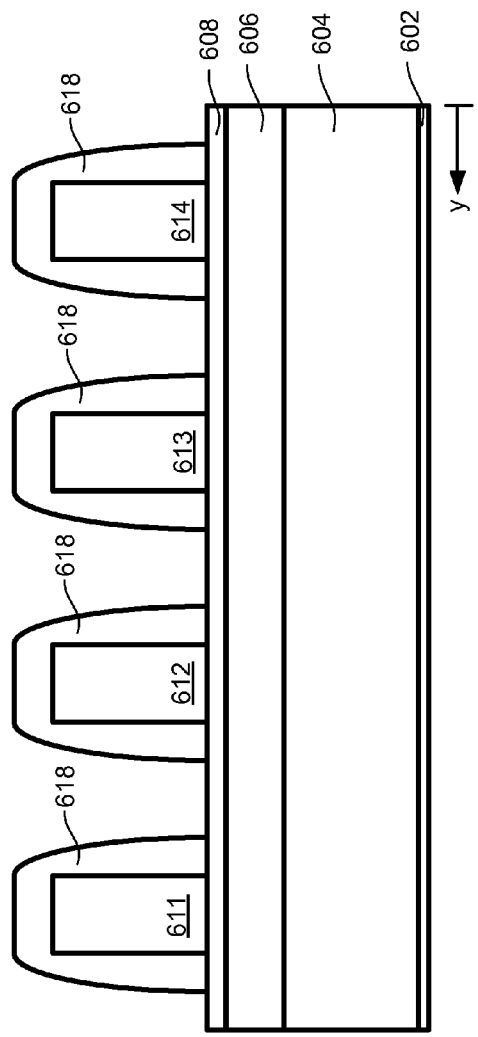

A next series of steps forms the spacers that are later used as a mask to form the individual charge storage regions. A conformal deposition process, such as low pressure chemical-vapor deposition (LPCVD), is used to form a conformal layer of polysilicon 618. A conformal deposition process forms a layer of polysilicon having a substantially uniform thickness on both the side portions and top portion of nitride strips 611-614. FIG. 6E depicts the portion of the memory array after depositing the polysilicon layer 618.

Figure 6F:
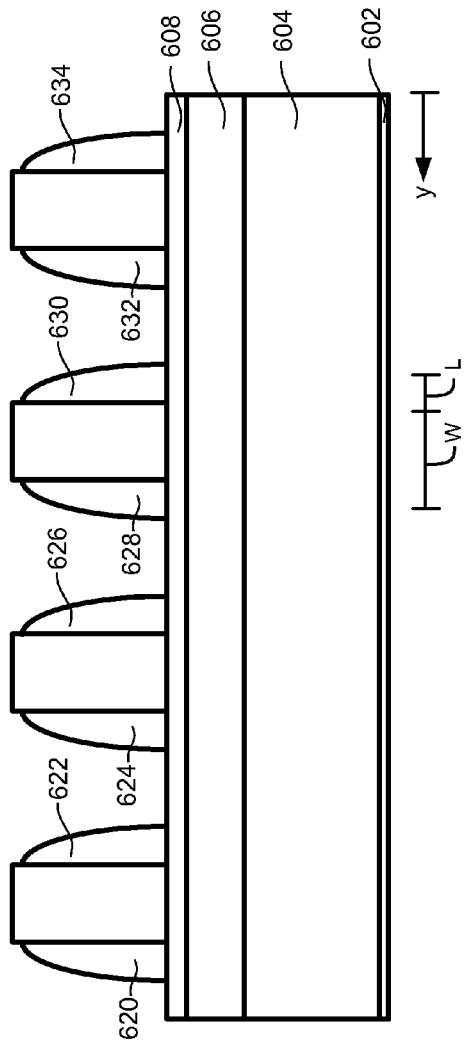

FIG. 6F depicts the memory array after etching the polysilicon layer to form individual polysilicon spacers 620-634. A dry etching process, for example reactive ion etching, is used in one embodiment to etch the polysilicon until the nitride strips 611-614 are reached. The thickness of the deposited polysilicon primarily determines a length L of the spacer, which in turn and as described later determines the length of the floating gates, which is significantly less than the minimum width of the process being used to form the structure. A width W of the nitride strips and the length L of the spacers are preferably chosen to result in substantially equal spacing of the spacers along the lengths of the polysilicon strips 604, since this determines the spacing of the resulting floating gates in the y-direction. An optional annealing process can be performed after etching to form the polysilicon spacers. The reactive ion etch used in forming the spacers can damage the polysilicon sidewalls. This can result in unwanted etching of the damaged polysilicon during subsequent nitride removal steps. Annealing the exposed polysilicon can prevent undesirable etching.

Figure 6G:
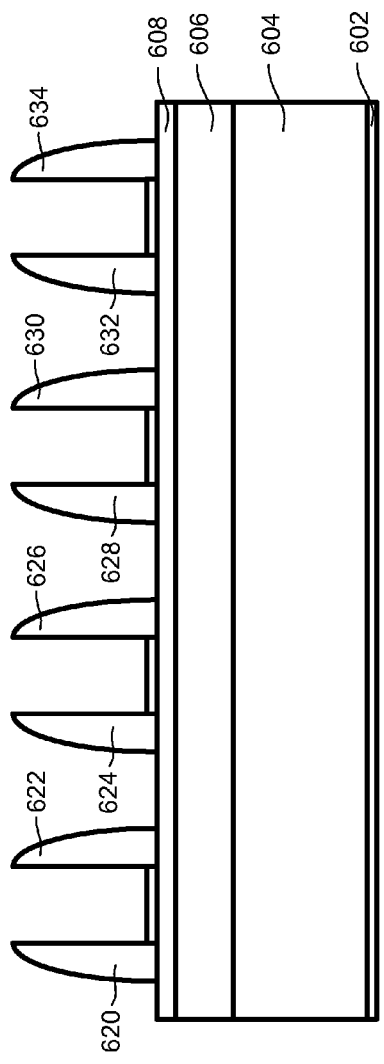

A wet etch is used to remove the nitride strips 611-614 after forming the individual spacers 616. The wet etch will leave the polysilicon spacers above the polysilicon etch stop layer 608. As previously described, the etch stop layer provides adhesion and support for the narrow and tall spacers resulting from the previous processes. FIG. 6G depicts the portion of the memory array after etching to remove the nitride strips.

After removing nitride strips 611-614, a combinational etch process is used to form the individual floating gate regions. A chemically non-selective etch is first used to remove the portions of intervening layer 608 and oxide pad layer 606 between and outside of spacers 620-634. The non-selective etch also removes the polysilicon spacers. After etching completely through the thin oxide pad layer 606, etching that is selective for polysilicon is used to etch through doped polysilicon layer 604.

Figure 6H:
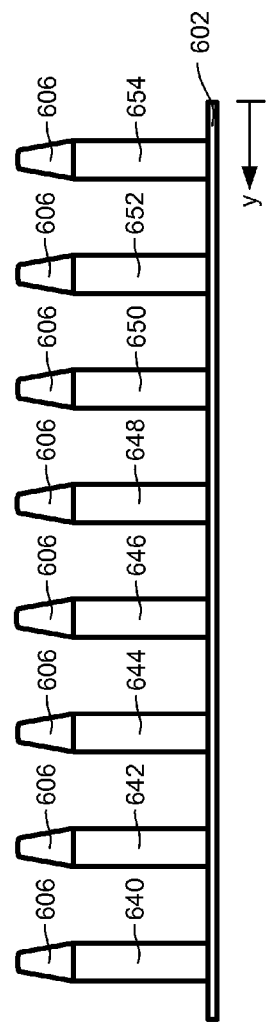

FIG. 6H depicts the individual floating gate regions resulting from the combinational etching applied with polysilicon spacers 620-634 formed above the polysilicon etch stop layer. The vertical profile of floating gate regions 640, 642, 644, 646, 648, 650, 652 and 654 is improved with respect to a profile achieved without employing a matched (relative to spacer composition) intervening layer. A traditional process that forms the spacer on top of the oxide pad tends to cause an inward taper of the spacer away from the surface of the substrate. In addition to providing adhesion and support for spacers 620-634, the intervening layer can serve as an etch stop to reduce etching of the HTO pad layer 606, thus providing a more vertical profile for the spacers. As illustrated in FIG. 6H, the portions of the thin oxide pad layer 606 above each floating gate region have substantially the same thickness as that of the original HTO layer. In a traditional process, it is likely that the oxide pad thickness would be undesirably reduced as a result of etching nitride layer 610.

Figure 6I:
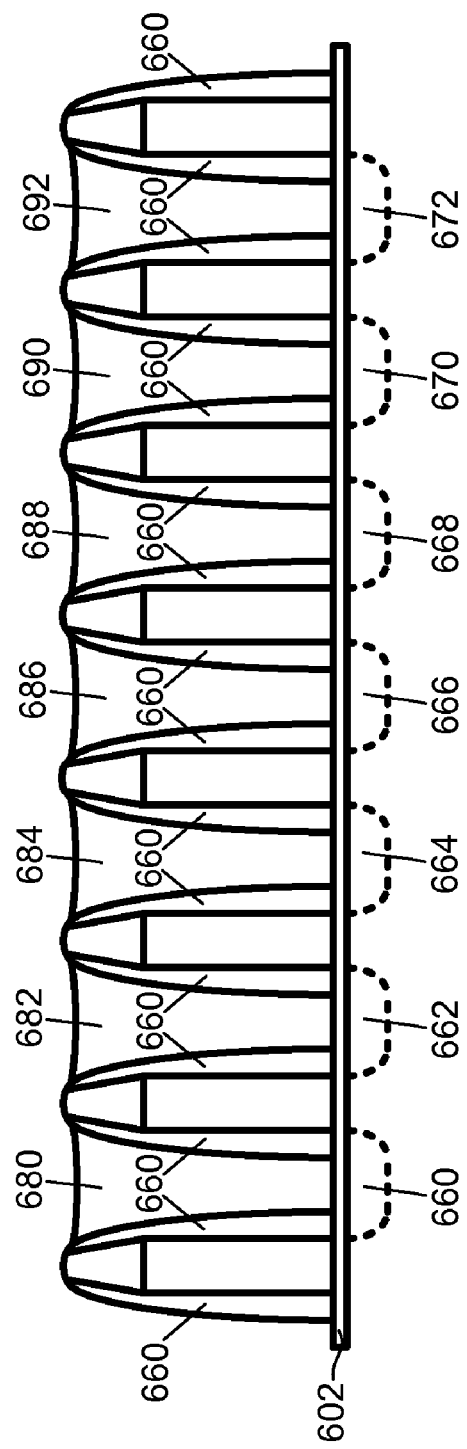

After etching the polysilicon to form floating gate regions, source and drain ion implantation can be performed, using the floating gates and oxide pads as a mask, as shown in FIG. 6I. Various ranges of N+ ion implant dose can be used, ranging from 5E13 to 1E15, for example. Implanted regions 660-672 between floating gates 640-654 are the result of ion implantation. An inter-gate dielectric 660 is then deposited and etched. The inter-gate dielectric is often ONO but other materials can be used. Conformal processes can be used to provide a substantially constant thickness of the inter-gate dielectric relative to the upper surface and sidewalls of floating gate regions 640-654. A second layer of doped polysilicon is then deposited, for example by LPCVD, over the array to fill the gaps between floating gates in contact with dielectric layer 660. Excess polysilicon is removed by CMP or anisotropic etch back to the top oxide layer of the ONO, or to the upper surface of thin oxide pad layer 606. An additional polysilicon etching step can be performed to ensure the polysilicon is not shorted between word lines and is adequately separated to form the individual word lines 680-692 as illustrated in FIG. 6I. The individual word lines 680-692 form the control gates for the memory cells. As described earlier, in the particular embodiment described in FIGS. 6A-6I, two control gates are provided for each floating gate, at the side thereof rather than above as in traditional NAND memory arrays. Various back-end processes can be performed to finalize fabrication of the array. For example, a passivation dielectric layer can be deposited, followed by forming metal conductive lines and vias to connect the lines with source and drain regions at the end of the memory cell strings, and the control gate lines along their length.

As previously mentioned, the formation of shallow trench or other isolation regions can be performed at different stages of the fabrication process. In one embodiment, the control gate layer is deposited and etched to form the word lines prior to etching the previously formed floating gate layer. The floating gate layer is then etched to form the individual floating gates. Isolation trenches can be formed at the end of the process, after patterning and forming both the control and floating gates.

Figure 7:
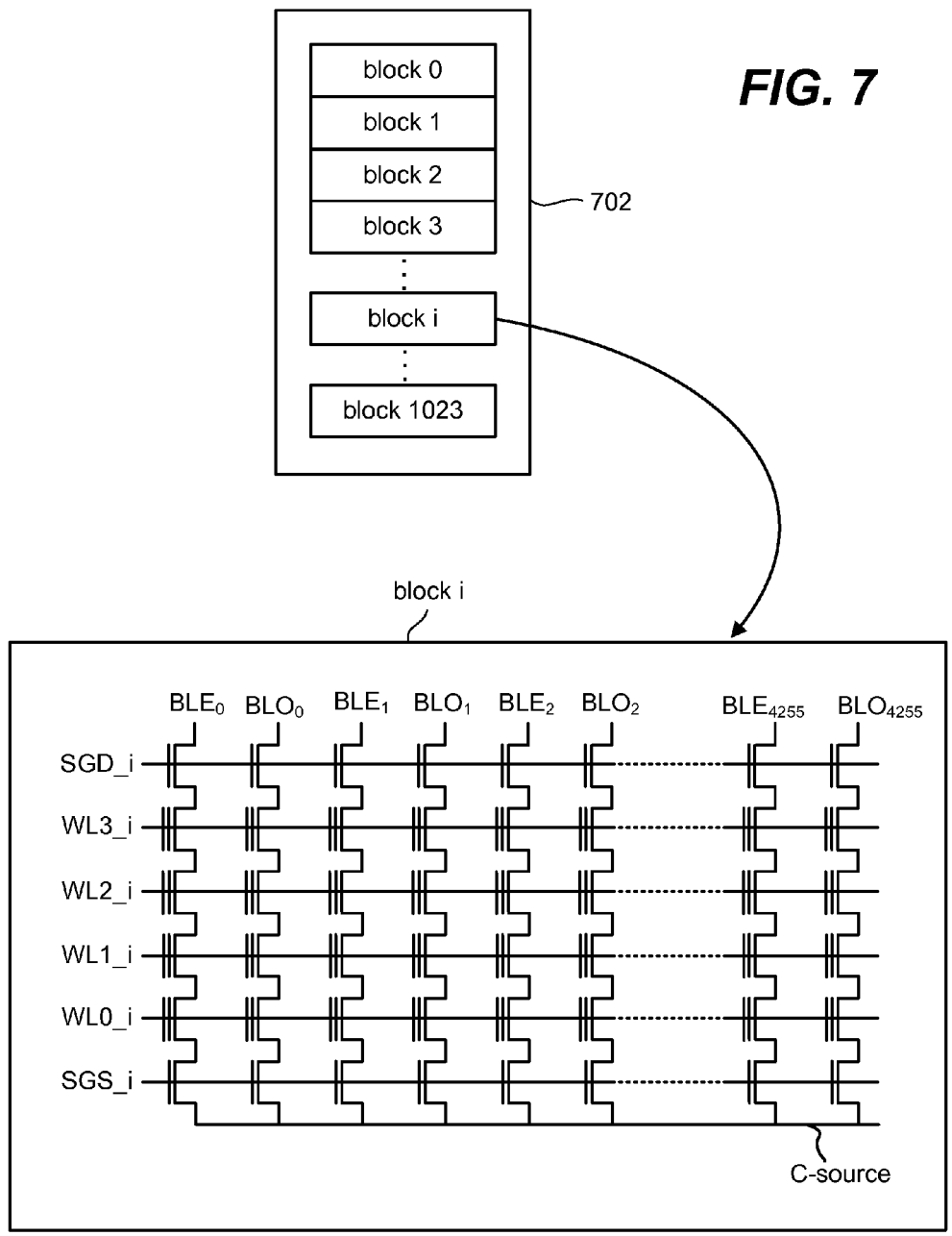
FIG. 7 depicts an exemplary organization of a memory array in accordance with one embodiment.

FIG. 7 depicts an exemplary structure of a memory cell array 702 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 7 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

Figure 8:
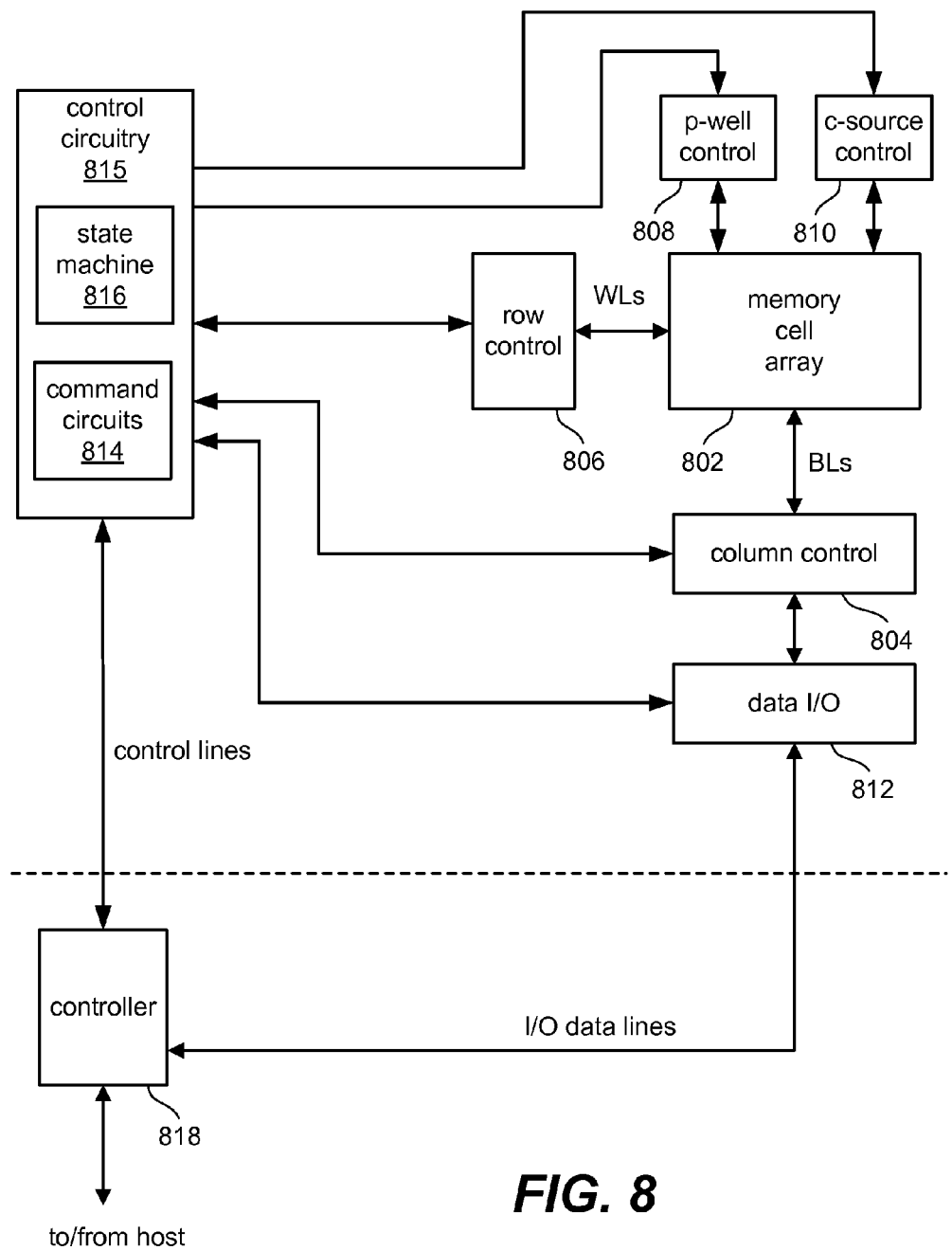
FIG. 8 is a block diagram of an exemplary memory system that can be used to implement one embodiment of the disclose technology.

FIG. 8 is a block diagram of one embodiment of a flash memory system that can be used to implement one or more embodiments of the present disclosure. Other systems and implementations can also be used. Memory cell array 802 is controlled by column control circuit 804, row control circuit 806, c-source control circuit 810 and p-well control circuit 808. Column control circuit 804 is connected to the bit lines of memory cell array 802 for reading data stored in the memory cells, for determining a state of the memory cells during a program operation, and for controlling potential levels of the bit lines to promote or inhibit programming and erasing. Row control circuit 806 is connected to the word lines to select one of the word lines, to apply read voltages, to apply program voltages combined with the bit line potential levels controlled by column control circuit 804, and to apply an erase voltage. C-source control circuit 810 controls a common source line (labeled as "C-source" in FIG. 7) connected to the memory cells. P-well control circuit 808 controls the p-well voltage.

The data stored in the memory cells are read out by the column control circuit 804 and are output to external I/O lines via data input/output buffer 812. Program data to be stored in the memory cells are input to the data input/output buffer 812 via the external I/O lines, and transferred to the column control circuit 804. The external I/O lines are connected to controller 818.

Command data for controlling the flash memory device is input to controller 818. The command data informs the flash memory of what operation is requested. The input command is transferred to state machine 816 which is part of control circuitry 815. State machine 816 controls column control circuit 804, row control circuit 806, c-source control 810, p-well control circuit 808 and data input/output buffer 812. State machine 816 can also output status data of the flash memory such as READY/BUSY or PASS/FAIL.

Controller 818 is connected to or connectable with a host system such as a personal computer, a digital camera, or personal digital assistant, etc. It communicates with the host that initiates commands, such as to store or read data to or from the memory array 802, and provides or receives such data. Controller 818 converts such commands into command signals that can be interpreted and executed by command circuits 814 which are part of control circuitry 815. Command circuits 814 are in communication with state machine 816. Controller 818 typically contains buffer memory for the user data being written to or read from the memory array.

One exemplary memory system comprises one integrated circuit that includes controller 818, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

It is claimed:

1. A method of making a non-volatile memory array using a semiconductor substrate, comprising:
    forming a layer of charge storage material across a surface of a substrate with a first layer of dielectric material therebetween;
    forming a layer of pad material over the layer of charge storage material;
    forming an intervening layer over the layer of pad material;
    forming a set of sacrificial strips having sidewalls elongated in a first direction over the intervening layer with spaces between strips adjacent in a second direction, the sidewalls extending in a substantially vertical direction with respect to the surface of the substrate, the first and second directions being substantially perpendicular;
    forming a set of spacers along the sidewalls of the sacrificial strips, the spacers having a lower surface in contact across an upper surface of the intervening layer which is over the layer of pad material, the spacers having a material composition that is similar to a material composition of the intervening layer;
    removing the set of sacrificial strips thereby exposing the intervening layer between spacers adjacent in the second direction;
    etching the intervening layer and the layer of charge storage material using the set of spacers as a pattern to form a plurality of charge storage regions separated in the second direction with spaces therebetween;
    forming an inter-gate dielectric layer after forming the plurality of charge storage regions; and
    forming a set of control gates for the plurality of charge storage regions, the control gates being separated from the charge storage regions by the inter-gate dielectric material.

2. The method of claim 1, wherein the memory array includes storage elements formed from the plurality of charge storage regions and the set of control gates, the storage elements of the array being arranged in rows and columns, the first direction corresponding to a direction of the rows and the second direction corresponding to a direction of the columns.

3. The method of claim 1, wherein removing the sacrificial strips comprises selectively etching the sacrificial strips with respect to the material composition of the intervening layer, the intervening layer providing an etch stop for the selective etching.

4. The method of claim 3, wherein:
    the charge storage regions have sidewalls elongated in the first direction and extending in a substantially vertical direction with respect to the surface of the substrate;
    forming the inter-gate dielectric layer comprises depositing the inter-gate dielectric layer along the sidewalls of the charge storage regions; and
    forming the set of control gates includes depositing conductive material to at least partially occupy the spaces between charge storage regions adjacent in the second direction, the control gates being separated from the sidewalls of the charge storage regions by the inter-gate dielectric layer, wherein each charge storage region is controlled by a pair of control gates to which it is adjacent in the second direction.

5. The method of claim 1 wherein:
    the intervening layer and the set of spacers are formed of undoped polysilicon.

6. The method of claim 5, wherein:
    the sacrificial material is silicon nitride; and
    the pad material is silicon oxide.

7. The method of claim 6, wherein:
the charge storage material is doped polysilicon.

8. The method of claim 1, wherein:
the intervening layer and the spacers have substantially similar coefficients of thermal expansion.

9. The method of claim 1, wherein:
the plurality of charge storage regions are floating gates arranged as a plurality of NAND strings having drain select gates and source select gates.

10. A method of making a non-volatile memory array including storage elements arranged into columns and rows, comprising:
forming a layer of charge storage material across a surface of a substrate with a first layer of dielectric material therebetween;
forming a layer of pad material over the layer of charge storage material;
forming an intervening layer over the layer of pad material;
forming a set of sacrificial strips elongated in a row direction over the intervening layer with spaces between strips adjacent in a column direction, the strips including sidewalls extending in a substantially vertical direction with respect to the surface of the substrate;
forming a set of spacers elongated in the row direction along the sidewalls of the sacrificial strips, the spacers having a material composition that is similar to a material composition of the intervening layer and a lower surface in contact across an upper surface of the intervening layer which is over the layer of pad material;
selectively etching the sacrificial strips with respect to the material composition of the intervening layer;
etching the intervening layer and the layer of charge storage material using the set of spacers as a pattern thereby forming a plurality of charge storage regions having sidewalls elongated in the row direction and extending in a substantially vertical direction with respect to the surface of the substrate, the charge storage regions being separated in the column direction with spaces therebetween;
forming a layer of dielectric material along the sidewalls of the charge storage regions; and
forming a set of control gates at least partially occupying the spaces between charge storage regions adjacent in the column direction, the control gates being separated from the charge storage regions by the layer of dielectric material.

11. The method of claim 10, wherein etching the intervening layer and the layer of charge storage material includes etching to remove the set of spacers.

12. The method of claim 10, further comprising:
prior to forming the intervening layer, etching the layer of charge storage material into a set of strips of charge storage material elongated in the column direction across the surface of the substrate;
etching the substrate to form a plurality of isolation trenches elongated in the column direction between strips of charge storage material adjacent in the row direction; and
filling the isolation trenches with an insulating material;
wherein etching the layer of charge storage material using the spacers as a mask includes etching the strips of charge storage material along their length in the column direction, the resulting plurality of charge storage regions including columns of charge storage regions formed from the individual strips.

13. The method of claim 10, wherein:
the intervening layer and the spacers are formed of undoped polysilicon.

14. The method of claim 13, wherein:
the sacrificial material is silicon nitride;
the pad material is silicon oxide; and
the charge storage material is doped polysilicon.

15. The method of claim 10, wherein:
the plurality of charge storage regions are floating gates arranged as a plurality of NAND strings having drain select gates and source select gates.

16. A method of fabricating non-volatile memory, comprising:
forming a first dielectric layer over a surface of a substrate;
forming a layer of charge storage material over the first dielectric layer;
forming an intervening layer of undoped polysilicon over the layer of charge storage material;
forming a set of sacrificial strips having sidewalls elongated in a row direction over the intervening layer, the sidewalls extending in a substantially vertical direction with respect to the surface of the substrate;
forming a set of undoped polysilicon spacers along the sidewalls of the sacrificial strips, the spacers having a lower portion in contact across an upper surface of the intervening layer;
removing the set of sacrificial strips thereby exposing the intervening layer between spacers adjacent in the second direction;
non-selectively etching to remove the intervening layer at exposed portions between the spacers;
selectively etching to form a plurality of charge storage regions separated in a column direction and having sidewalls elongated in the row direction;
forming an inter-gate dielectric layer along the sidewalls of the charge storage regions; and
forming a set of control gates between charge storage regions adjacent in the column direction, the control gates being separated from the charge storage regions by the inter-gate dielectric layer.

17. A method according to claim 16, further comprising:
prior to forming the intervening layer, etching the layer of charge storage material into a set of strips of charge storage material elongated in the column direction across the surface of the substrate;
etching the substrate to form a plurality of isolation trenches elongated in the column direction between strips of charge storage material adjacent in the row direction; and
filling the isolation trenches with an insulating material;
wherein etching the layer of charge storage material using the spacers as a mask includes etching the strips of charge storage material along their length in the column direction, the resulting plurality of charge storage regions including columns of charge storage regions formed from the individual strips.

18. A method according to claim 16, wherein:
the plurality of charge storage regions are floating gates arranged as a plurality of NAND strings having drain select gates and source select gates.

* * * * *

UNITED STATES PATENT AND TRADEMARK OFFICE
CERTIFICATE OF CORRECTION

| | |
|---|---|
| PATENT NO. | : 7,960,266 B2 |
| APPLICATION NO. | : 12/791103 |
| DATED | : June 14, 2011 |
| INVENTOR(S) | : Kai et al. |

It is certified that error appears in the above-identified patent and that said Letters Patent is hereby corrected as shown below:

On the Title Page, item 73 Assignee: Delete "SanDisk Corporation, Milpitas, CA (US)" and replace with -- SanDisk Technologies Inc., Plano, TX (US) --

Signed and Sealed this
Twelfth Day of July, 2011

David J. Kappos
*Director of the United States Patent and Trademark Office*